US008841667B2

(12) United States Patent
Chang et al.

(10) Patent No.: US 8,841,667 B2
(45) Date of Patent: Sep. 23, 2014

(54) TRANSISTOR STRUCTURE AND DRIVING CIRCUIT STRUCTURE

(75) Inventors: Jyu-Yu Chang, Taichung (TW);
Chun-Wei Lai, Taichung (TW);
Po-Yuan Shen, Taichung (TW);
Wen-Jung Lee, New Taipei (TW);
Chih-Wei Tai, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/565,796

(22) Filed: Aug. 3, 2012

(65) Prior Publication Data
US 2013/0306968 A1    Nov. 21, 2013

(30) Foreign Application Priority Data
May 21, 2012    (TW) ............................. 101117988 A (51) Int. Cl.
*H01L 29/04* (2006.01)
(52) U.S. Cl.
USPC ................ 257/57; 257/59; 257/287; 257/365
(58) Field of Classification Search
USPC .............................. 257/59, 194, 57, 347, 287
See application file for complete search history.

(56) References Cited

U.S. PATENT DOCUMENTS

| 6,114,732 | A * | 9/2000 | Sugimura et al. ............. 257/365 |
| 7,068,418 | B2 | 6/2006 | Kawase |
| 7,265,399 | B2 * | 9/2007 | Sriram et al. ................. 257/287 |
| 7,361,594 | B2 | 4/2008 | Kawase et al. |
| 7,868,357 | B2 | 1/2011 | Chang |
| 8,344,390 | B2 | 1/2013 | Matsumuro et al. |
| 8,742,424 | B2 | 6/2014 | Yamasaki et al. |
| 2005/0151195 | A1 * | 7/2005 | Kawase et al. ................. 257/347 |
| 2006/0091498 | A1 * | 5/2006 | Sriram et al. ................. 257/578 |
| 2010/0084659 | A1 * | 4/2010 | Chang .............................. 257/59 |
| 2010/0258803 | A1 * | 10/2010 | Matsumuro ...................... 257/59 |
| 2012/0241747 | A1 * | 9/2012 | Yamasaki et al. ................ 257/59 |

FOREIGN PATENT DOCUMENTS

| CN | 100416883 | 9/2008 |
| CN | 101842904 | 9/2010 |
| CN | 101582252 | 8/2011 |
| TW | 200644245 | 12/2006 |

(Continued)

OTHER PUBLICATIONS

"Office Action of China Counterpart Application", issued on May 5, 2014, p. 1-p. 12, in which the listed references (Ref. 1-4) were cited.

(Continued)

*Primary Examiner* — Matthew W Such
*Assistant Examiner* — Frederick B Hargrove
(74) *Attorney, Agent, or Firm* — Jianq Chyun IP Office (57) ABSTRACT

A transistor structure disposed on a substrate includes a gate electrode, a gate insulating layer overlapping the gate electrode, a channel layer overlapping the gate electrode, and a plurality of first electrodes and a plurality of second electrodes overlapping the gate electrode. The gate insulating layer is disposed between the channel layer and the gate electrode. Besides, the gate insulating layer is located among the first electrodes, the second electrodes, and the gate electrode. The first electrodes and the second electrodes are alternately arranged along a first direction. Each of the first electrodes has a first width along the first direction. Each of the second electrodes has a second width along the first direction. A ratio of the first width to the second width ranges from 2 to 20. A driving circuit structure having the transistor structure is also provided.

6 Claims, 9 Drawing Sheets

(56) References Cited

FOREIGN PATENT DOCUMENTS

| TW | 200826296 | 6/2008 |
| TW | 200931700 | 7/2009 |
| TW | I328878 | 8/2010 |
| TW | 201220949 | 5/2012 |
| WO | 2011065055 | 6/2011 |

OTHER PUBLICATIONS

"Office Action of Taiwan Counterpart Application", issued on Jun. 12, 2014, p. 1-p. 11, in which the listed references (Ref. 5-7) were cited.

* cited by examiner

Amount of threshold voltage shift

TRANSISTOR STRUCTURE AND DRIVING CIRCUIT STRUCTURE

CROSS-REFERENCE TO RELATED APPLICATION

This application claims the priority benefit of Taiwan application serial no. 101117988, filed on May 21, 2012. The entirety of the above-mentioned patent application is hereby incorporated by reference herein and made a part of this specification.

BACKGROUND OF THE INVENTION

1. Field of the Invention

The invention relates to a semiconductor device structure and a circuit structure. More particularly, the invention relates to a transistor structure and a driving circuit structure.

2. Description of Related Art

Among various flat panel displays, thin film transistor liquid crystal displays (TFT-LCD) characterized by great space utilization, low power consumption, non-radiation, and low electromagnetic interference gain popularity among consumers. The TFT-LCD is mainly constituted by an active array substrate, a color filter substrate, and a liquid crystal layer sandwiched between the two substrates. The active array substrate has an active region and a peripheral circuit region. An active array is located within the active region, and a driving circuit is located within the peripheral circuit region.

A TFT with a high width-to-length (W/L) ratio of the channel is often employed in the driving circuit within the peripheral circuit region, for instance. In general, an on-current Ion of the TFT is in direct proportion to the W/L ratio, and the on-current Ion satisfies the following equation:

$$Ion = U * W/L (V_G - V_{th}) V_D$$

Here, U refers to carrier mobility, W denotes the channel width, L denotes the channel length, $V_G$ represents a gate voltage, $V_{th}$ refers to a threshold voltage, and $V_D$ refers to a drain voltage. According to said equation, the increase in the channel width and the decrease in the channel length may increase the W/L ratio and raise the on-current Ion. Nonetheless, when the channel width is increased, and the channel length is decreased, the notable self-heating effect of the TFT may deteriorate the stability and reliability of the TFT.

SUMMARY OF THE INVENTION

The invention is directed to a transistor structure featuring favorable stability and reliability.

In an embodiment of the invention, a transistor structure disposed on a substrate is provided. The transistor structure includes a gate electrode, a gate insulating layer overlapping the gate electrode, a channel layer overlapping the gate electrode, and a plurality of first electrodes and a plurality of second electrodes overlapping the gate electrode. The gate insulating layer is disposed between the channel layer and the gate electrode. Besides, the gate insulating layer is located among the first electrodes, the second electrodes, and the gate electrode. The first electrodes and the second electrodes are alternately arranged along a first direction. Each of the first electrodes has a first width along the first direction. Each of the second electrodes has a second width along the first direction. A ratio of the first width to the second width ranges from 2 to 20.

According to an embodiment of the invention, when the first electrodes are source electrodes, the second electrodes are drain electrodes, and when the first electrodes are drain electrodes, the second electrodes are source electrodes.

According to an embodiment of the invention, the ratio of the first width to the second width ranges from 2.2 to 10.

According to an embodiment of the invention, the ratio of the first width to the second width ranges from 2.5 to 5.

According to an embodiment of the invention, the channel layer includes a semiconductor layer.

According to an embodiment of the invention, a material of the semiconductor layer includes silicon, germanium, or a metal oxide semiconductor.

According to an embodiment of the invention, a channel length between the first electrodes and the second electrodes along the first direction ranges from about 0.1 µm to about 30 µm.

According to an embodiment of the invention, a channel width between the first electrodes and the second electrodes is perpendicular to the first direction, and the channel width ranges from about 10 µm to about 30000 µm.

According to an embodiment of the invention, the channel layer is located among the first electrodes, the second electrodes, and the gate electrode.

According to an embodiment of the invention, the first electrodes and the second electrodes are located between the channel layer and the gate electrode.

According to an embodiment of the invention, the gate electrode is located among the first electrodes, the second electrodes, and the substrate.

According to an embodiment of the invention, the first electrodes and the second electrodes are located between the gate electrode and the substrate.

According to an embodiment of the invention, the transistor structure further includes a first connection line and a second connection line. The first connection line is electrically connected to the first electrodes, and the second connection line is electrically connected to the second electrodes.

According to an embodiment of the invention, the first electrodes and the second electrodes extend along a second direction, and the second direction is substantially perpendicular to the first direction.

In an embodiment of the invention, another transistor structure having film layers and structural design similar to those of the aforesaid transistor structure is provided. The main difference between the two transistor structures lies in that the first connection line of the transistor structure herein overlaps the gate electrode, and the first and second electrodes are located at two sides of the first connection line and alternately arranged along the first direction.

In an embodiment of the invention, yet another transistor structure that includes a gate electrode, a gate insulating layer, a channel layer, a first electrode, and a second electrode is provided. The gate insulating layer overlaps the gate electrode. The channel layer overlaps the gate electrode, and the gate insulating layer is located between the channel layer and the gate electrode. The first and second electrodes overlap the gate electrode, and the gate insulating layer is located among the first electrode, the second electrode, and the gate electrode. The first and second electrodes are disposed at two sides of the channel layer and arranged along a first direction. The first electrode has a first width along the first direction. The second electrode has a second width along the first direction. A ratio of the first width to the second width ranges from 2 to 20.

In an embodiment of the invention, a driving circuit structure having the aforesaid transistor structure is provided. The driving circuit structure is disposed on a substrate and includes a plurality of shift registers electrically connected to one another. Each of the shift registers has at least one of the above-mentioned transistor structures.

In view of the above, the first and second electrodes are alternately arranged on the gate electrode, and the transistor structure can achieve satisfactory heat dissipation effects through adjustment of the ratio of the first width to the second width. Thereby, the self-heating effect of the transistor structure may be alleviated, and the reliability of the transistor structure may be enhanced.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
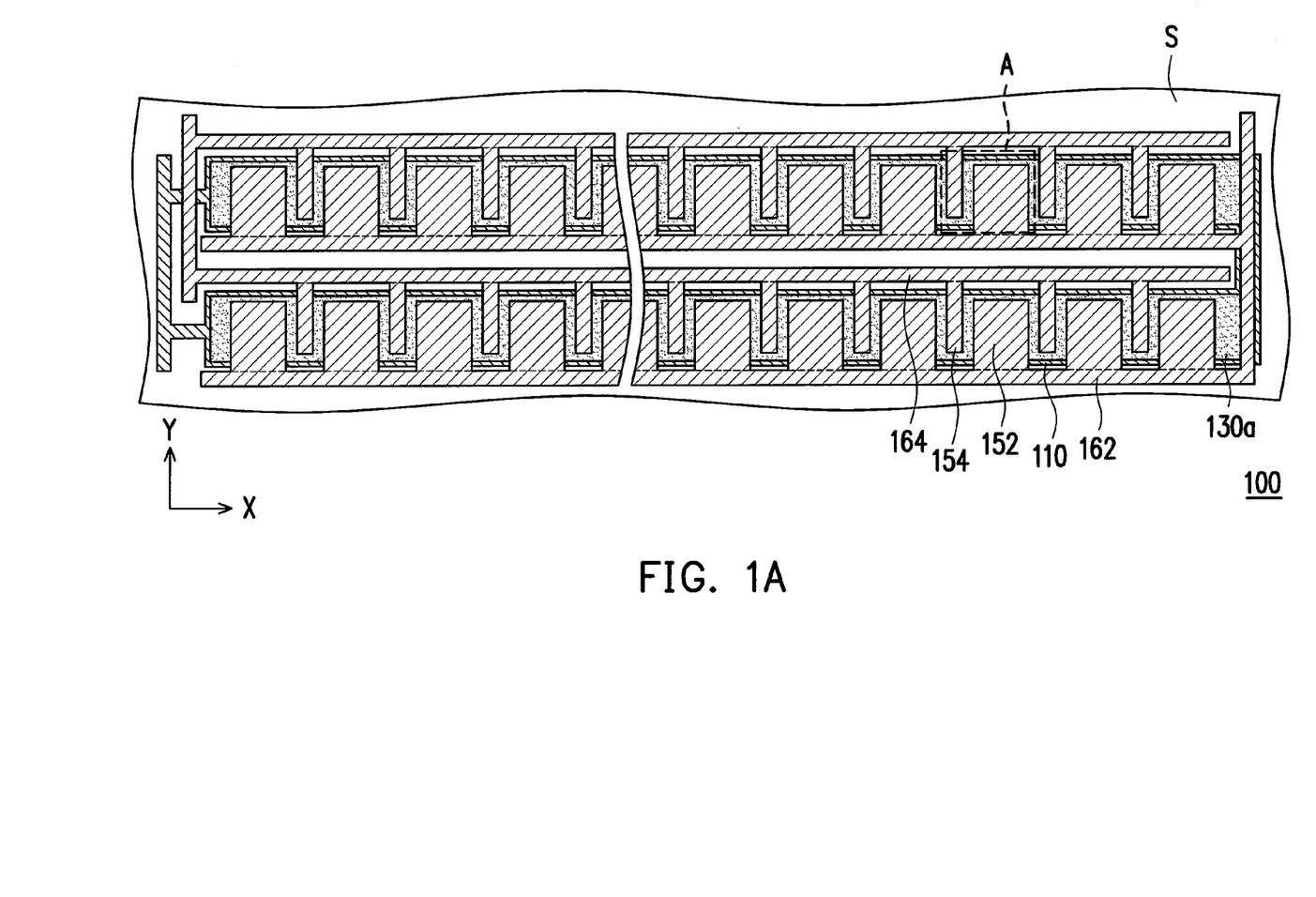
FIG. 1A is a schematic top view illustrating a transistor structure according to an embodiment of the invention.
Figure 1B:
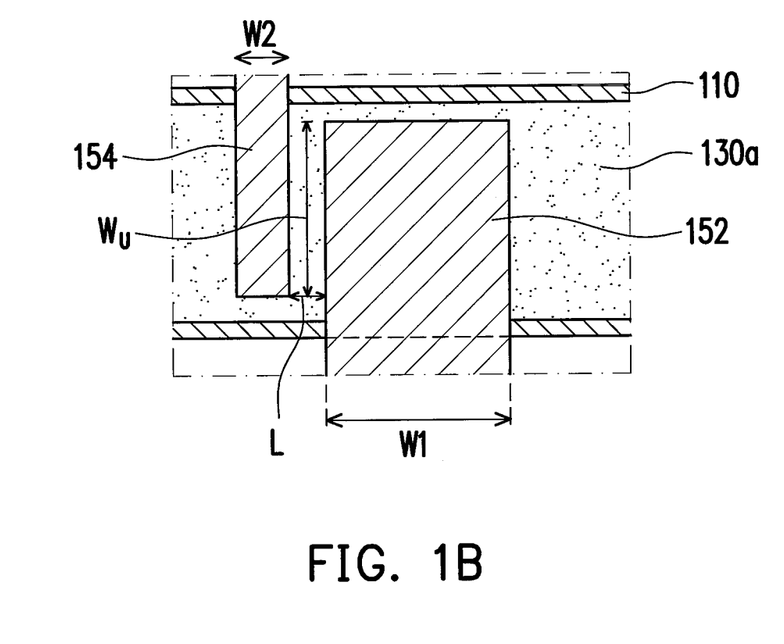
FIG. 1B is an enlarged view schematically illustrating an area A depicted in FIG. 1A.

FIG. 1A is a schematic top view illustrating a transistor structure according to an embodiment of the invention. FIG. 1B is an enlarged view schematically illustrating an area A depicted in FIG. 1A. With reference to FIG. 1A and FIG. 1B, the transistor structure 100 described in this embodiment is disposed on a substrate S, and the substrate S may be made of glass, alkali glass, quartz, polyester, polycarbonate, flexible plastic materials, other flexible materials, or any other appropriate material. Specifically, the transistor structure 100 includes a gate electrode 110, a channel layer 130a overlapping the gate electrode 110, and a plurality of first electrodes 152 and a plurality of second electrodes 154 overlapping the gate electrode 110.

The channel layer 130a may include a semiconductor layer. That is, the channel layer 130a may be a semiconductor layer having the single-layer structure or the multi-layer structure. In the present embodiment, the semiconductor layer is made of silicon, germanium, or a metal oxide semiconductor. Here, silicon may include amorphous silicon, microcrystalline silicon, polycrystalline silicon, or monocrystalline silicon, for instance; germanium may include amorphous germanium, microcrystalline germanium, polycrystalline germanium, monocrystalline germanium, or silicon-germanium alloy, for instance; the metal oxide semiconductor may include indium gallium zinc oxide (IGZO), indium zinc oxide (IZO), and so on, for instance. However, the invention is not limited thereto. The first electrodes 152 and the second electrodes 154 are alternately arranged along a first direction X. In the present embodiment, the first and second electrodes 152 and 154 are alternately arranged in parallel along the first direction X and extended along a second direction Y that is perpendicular to the first direction X, for instance.

Besides, when the first electrodes 152 are source electrodes, the second electrodes 154 are drain electrodes, and when the first electrodes 152 are drain electrodes, the second electrodes 154 are source electrodes. In this embodiment, the first electrodes 152 are source electrodes, and the second electrodes 154 are drain electrodes, for instance, which should however not be construed as a limitation to the invention. Namely, according to another embodiment of the invention, the first electrodes 152 may be drain electrodes, and the second electrodes 154 may be source electrodes.

There is a channel length L between the first electrodes 152 and the second electrodes 154 along the first direction X, and there is a channel width between the first electrodes 152 and the second electrodes 154 along the second direction Y that is perpendicular to the first direction X. In the transistor structure 100 described herein, the first electrodes 152 and the second electrodes 154 are alternately arranged in parallel on the gate electrode 110, so as to increase the ratio of the channel width to the channel length L. Hence, the channel width refers to the total of the unit channel width $W_u$ between each first electrode 152 and each second electrode 154 of the transistor structure 100. According to the present embodiment, the channel length L ranges from about 0.1 μm to about 30 μm, and the channel width ranges from about 10 μm to about 30000 μm, for instance.

It should be mentioned that the transistor structure 100 described herein may be formed by repeatedly arranging the transistor structure unit shown in FIG. 1B, wherein the transistor structure unit shown in FIG. 1B is composed of one first electrode 152 and one second electrode 154. Note that the transistor structure unit, if actually applied, may act as an independently functional transistor structure.

In the present embodiment, each of the first electrodes 152 has a first width W1 along the first direction X, and each of the second electrodes 154 has a second width W2 along the first direction X. In consideration of the requirements for large-size panels and slim border design at present, the on-current of the transistor structure need be increased while the given space is limited. Nevertheless, the increase in the channel width of the transistor structure violates the space utilization principle. As a result, the on-current of the transistor structure is often increased by reducing the channel length of the transistor structure. The reduction of the channel length of the transistor structure often induces the self-heating effect, which deteriorates the reliability of the transistor structure. Accordingly, in the present embodiment, the first width W1 of the first electrodes 152 is properly increased (i.e., the ratio of the first width W1 to the second width W2 is modulated), such that the transistor structure 100 can accomplish favorable heat dissipation effects. Consequently, the self-heating effect of the transistor structure 100 may be alleviated, and the reliability of the transistor structure 100 may be enhanced.

Particularly, the ratio of the first width W1 to the second width W2 ranges from 2 to 20 according to the present embodiment. In other embodiments, the ratio of the first width W1 to the second width W2 ranges from 2.2 to 10 or from 2.5 to 5.

The transistor structure 100 described herein further includes a first connection line 162 and a second connection line 164. The first electrodes 152 are electrically connected to one another through the first connection line 162, and the second electrodes 154 are electrically connected to one another through the second connection line 164. In this embodiment, the first electrodes 152 and the first connection line 162 together form a comb-shaped structure, and so do the second electrode 154 and the second connection line 164, for instance. Note that this should not be construed as a limitation to the invention. Another embodiment is further provided below with reference to FIG. 2A and FIG. 2B for describing the invention.

Figure 2A:
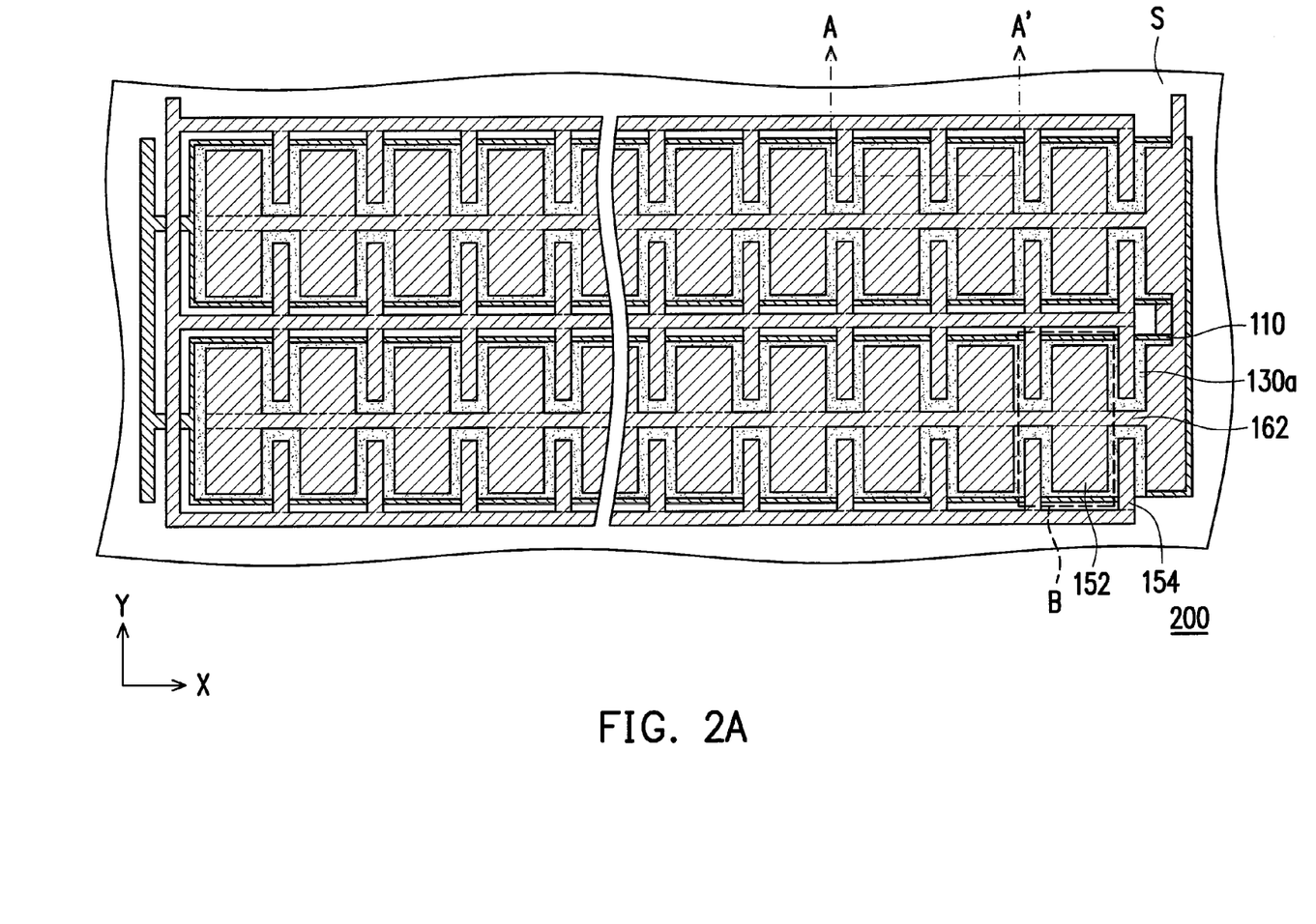
FIG. 2A is a schematic top view illustrating a transistor structure according to another embodiment of the invention.
Figure 2B:
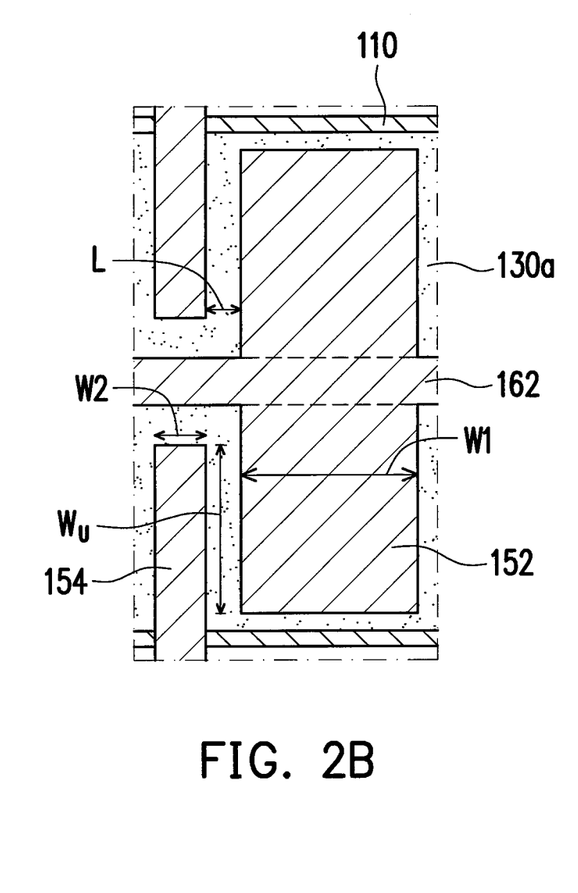
FIG. 2B is an enlarged view schematically illustrating an area B depicted in FIG. 2A.

FIG. 2A is a schematic top view illustrating a transistor structure according to another embodiment of the invention. FIG. 2B is an enlarged view schematically illustrating an area B depicted in FIG. 2A. With reference to FIG. 2A and FIG. 2B, the transistor structure 200 described in the present embodiment has film layers and structural design similar to those of the transistor structure 100 depicted in FIG. 1A.

The main difference between the two transistor structures 200 and 100 lies in that the first connection line of the transistor structure 200 overlaps the gate electrode 110, and the first and second electrodes 152 and 154 are located at two sides of the first connection line 162 and alternately arranged along the first direction X.

According to the present embodiment, the channel length L ranges from about 0.1 μm to about 30 μm, and the channel width ranges from about 10 μm to about 30000 μm, for instance. The channel width herein refers to the total of the unit channel width $W_U$ between each first electrode 152 and each second electrode 154 of the transistor structure 200. Besides, each of the first electrodes 152 has a first width W1 along the first direction X, and each of the second electrodes 154 has a second width W2 along the first direction X. The ratio of the first width W1 to the second width W2 ranges from 2 to 20. In other embodiments, the ratio of the first width W1 to the second width W2 preferably ranges from 2.2 to 10 or more preferably from 2.5 to 5.

Similarly, in the present embodiment, the first width W1 of the first electrodes 152 in the transistor structure 200 is properly increased (i.e., the ratio of the first width W1 to the second width W2 is modulated), such that the transistor structure 200 can accomplish favorable heat dissipation effects. Thereby, the self-heating effect of the transistor structure 200 may be alleviated, and the reliability of the transistor structure 200 may be enhanced.

Figure 3:
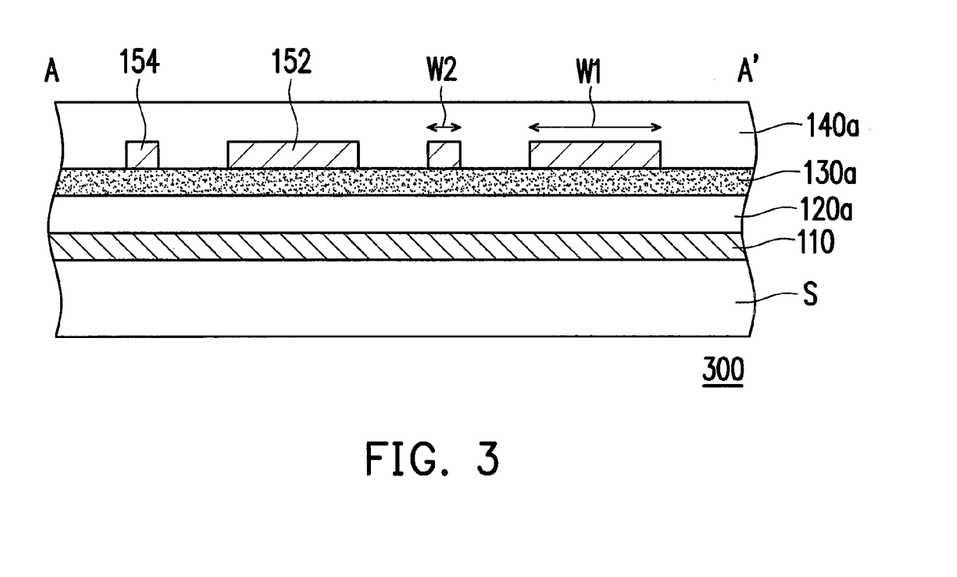
FIG. 3 is a schematic cross-sectional view taken along a section line A-A' depicted in FIG. 2A.

The cross-sectional view of the transistor structure is further described below. FIG. 3 is a schematic cross-sectional view taken along a section line A-A' depicted in FIG. 2A. The cross-sectional structure of FIG. 3 is an exemplary embodiment to the transistor structure 200 depicted in FIG. 2A, while the cross-sectional structures discussed hereinafter are applicable to the transistor structure 100 as well. With reference to FIG. 3, in addition to the gate electrode 110, the channel layer 130a, the first electrodes 152, and the second electrodes 154, the transistor structure 300 further includes a gate insulating layer 120a overlapping the gate electrode 110. According to the present embodiment, the transistor structure 300 is a bottom-gate transistor structure, for instance. To be more specific, the gate electrode 110 is disposed on the substrate S, and the gate insulating layer 120a is disposed between the channel layer 130a and the gate electrode 110. The first electrodes 152, the second electrodes 154, and the first connection line (shown in FIG. 2A) are configured at one side of the channel layer 130a away from the gate electrode 110. The gate insulating layer 120a is made of an inorganic material, an organic material, or a combination thereof. Here, the inorganic material may be silicon oxide, silicon nitride, silicon oxynitride, silicon aluminum oxide, or a stacked layer containing at least two of the above-mentioned materials, for instance. Certainly, the invention is not limited thereto, and any material with insulation properties may be selectively utilized for forming the gate insulating layer 120a according to the present embodiment.

The transistor structure 300 described herein may selectively include a protection layer 140a overlapping the gate electrode 110. The protection layer 140a is configured at one side of the uppermost layer farthest away from the substrate S for protection.

Note that the transistor structure 300 is merely exemplary and should not be construed as a limitation to the invention. In other words, the transistor structure may be a bottom-gate coplanar structure or a top-gate transistor structure according to other embodiments. The transistor structures are further elaborated below with reference to FIG. 4, FIG. 5, and FIG. 6.

Figure 4:
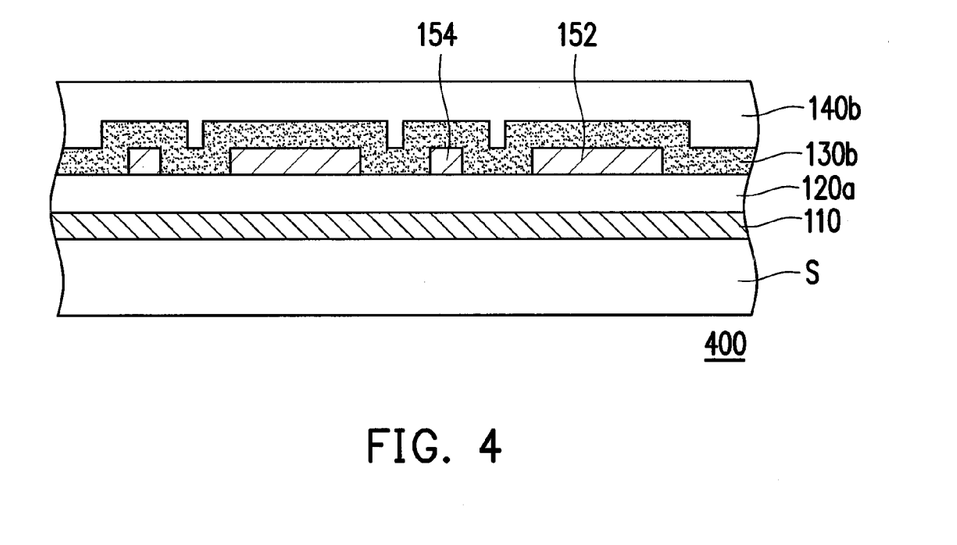
FIG. 4 to FIG. 6 are schematic cross-sectional views illustrating other transistor structures according to other embodiments of the invention.

FIG. 4 to FIG. 6 are schematic cross-sectional views illustrating other transistor structures according to other embodiments of the invention. As shown in FIG. 4, the transistor structure 400 described in the present embodiment is a bottom-gate coplanar structure, for instance. Specifically, the transistor structure 400 and the transistor structure 200 depicted in FIG. 3 have identical or similar film layers, while the difference between the two transistor structures rests in that the first electrodes 152 and the second electrodes 154 in the transistor structure 400 are located between the channel layer 130b and the gate electrode 110. The transistor structure 400 described herein may selectively include a protection layer 140b covering said film layers, and the protection layer 140a is configured at one side of the channel layer 130b away from the substrate S and is in contact with the channel layer 130b.

Figure 5:
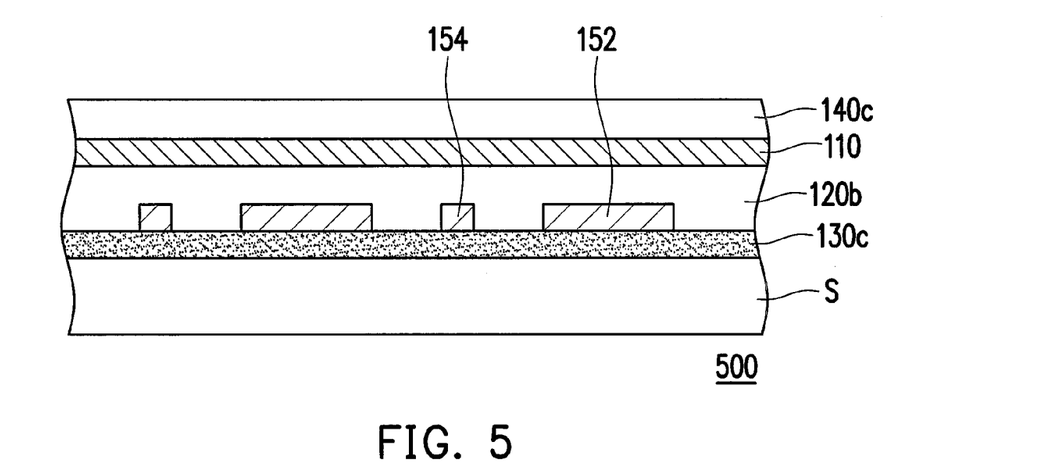

With reference to FIG. 5, the transistor structure 500 described in the present embodiment is a top-gate transistor structure, for instance. The transistor structure 500 and the transistor structure 300 depicted in FIG. 3 have identical or similar film layers. The difference between the two transistor structures rests in that the first electrodes 152 and the second electrodes 154 in the transistor structure 500 are located between the gate electrode 110 and the substrate S, the gate insulating layer 120b covers the first and second electrodes 152 and 154, and the channel layer 130c is in contact with the substrate S. Certainly, the transistor structure 500 described herein may selectively include a protection layer 140c covering said film layers, and the protection layer 140c is configured at one side of the gate electrode 110 away from the substrate S and is in contact with the gate electrode 110.

Figure 6:
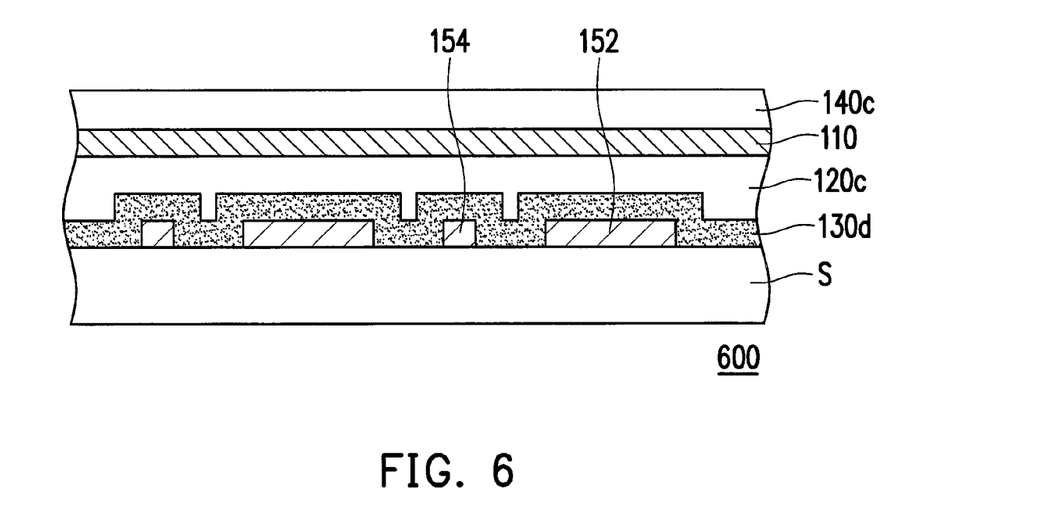

With reference to FIG. 6, the transistor structure 600 described in the present embodiment is a top-gate coplanar structure, for instance. The transistor structure 600 and the transistor structure 500 depicted in FIG. 5 have identical or similar film layers. The difference between the two transistor structures rests in that the channel layer 130d in the transistor structure 600 is located among the first electrodes 152, the second electrodes 154, and the gate electrode 110, and the gate insulating layer 120c covers the channel layer 130d and is in contact with the channel layer 130d.

Figure 7:
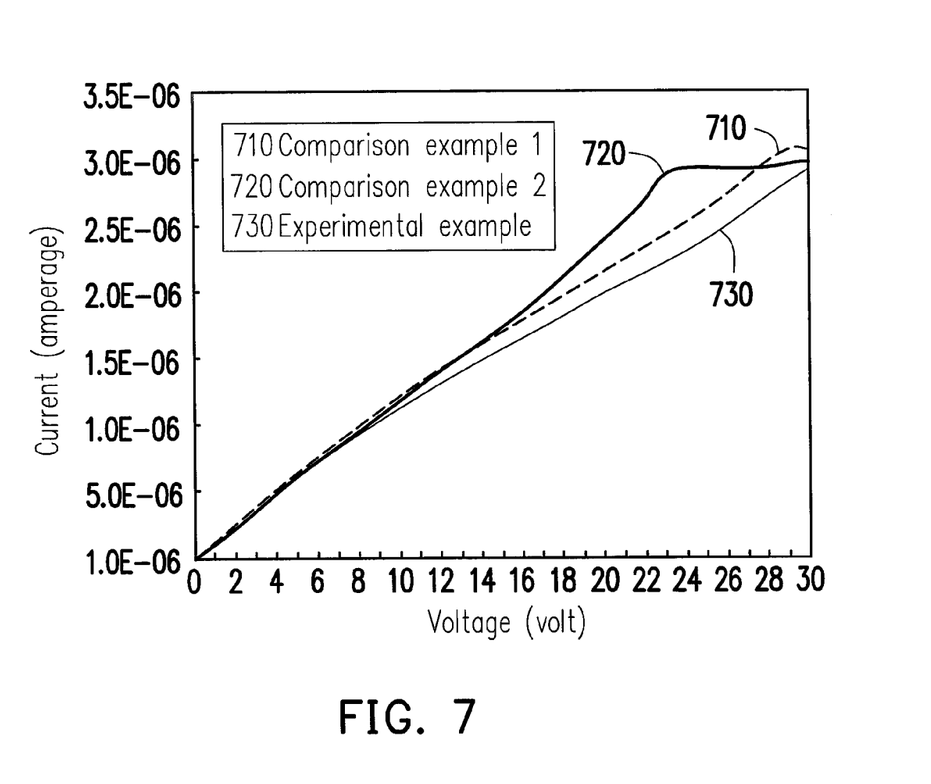
FIG. 7 is a chart illustrating current and voltage correlation curves (I-V curves) when the transistor structure has different W/L ratios and different first widths.
Figure 8:
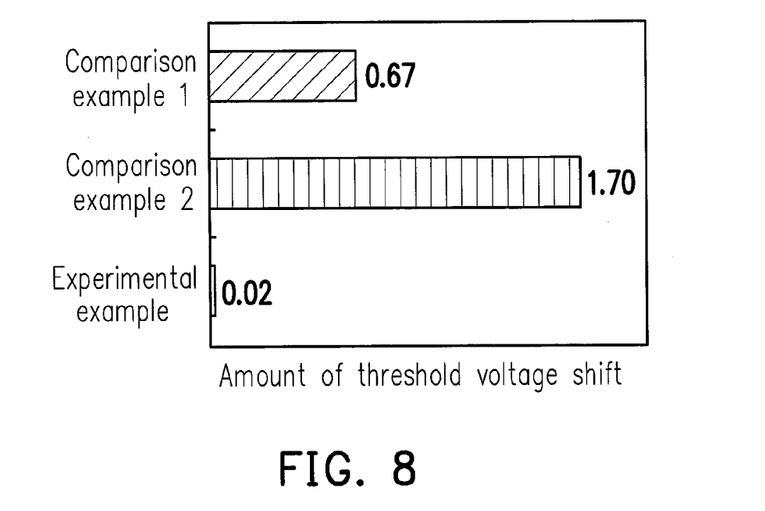
FIG. 8 is a chart illustrating hot carrier stress comparison when the transistor structure has different W/L ratios and different first widths.

Experiments are conducted and described below to verify the performance improvement of the transistor structure described in the embodiments of the invention in comparison with the conventional transistor structure. FIG. 7 is a chart illustrating current and voltage correlation curves (I-V curves) when the transistor structure has different W/L ratios and different first widths. FIG. 8 is a chart illustrating hot carrier stress comparison when the transistor structure has different W/L ratios and different first widths.

Three sets of data shown in FIG. 7 and FIG. 8 are obtained by measuring the transistor structures respectively provided in the experimental example, the comparison example 1, and the comparison example 2, given that the channel width of the transistor structures and the relative voltage applied to the transistors structures remain unchanged. The transistor structures respectively provided in the experimental example, the comparison example 1, and the comparison example 2 have different W/L ratios or different first widths. Particularly, the channel length of the transistor structure in the experimental example is approximately 3.5 μm. Since the structural design described above is applied herein, the first width of the first electrode is increased to 13.2 μm approximately, the second width of the second electrode is increased to 4.4 μm approximately, and the ratio of the first width to the second width is 3 μm approximately. By contrast, in the comparison example 1, the channel length of the transistor structure is approximately 5.5 μm, the first width and the second width are about 4.4 μm, respectively, and the ratio of the first width to the second width is about 1 μm. In the comparison example 2, the channel length of the transistor structure is approximately 3.5 μm, the first width is about 4.0 μm, the second width is about 4.4 μm, and the ratio of the first width to the second width is about 0.9 μm.

As shown in FIG. 7, the curve 730 is the I-V curve according to the experimental example (i.e., the ratio of the first width W1 to the second width W2 conforms to the conditions described in the invention), the curve 710 is the I-V curve according to the comparison example 1, and the curve 720 is the I-V curve according to the comparison example 2. As shown by the curves 710 and 720, before the first width is adjusted, the reduction of the channel length is apt to cause premature current saturation in the transistor structure. After the first width is adjusted, notwithstanding the reduction of the channel length, the I-V performance in the experimental example is greater than that in the comparison example 1 (i.e., no current saturation is observed).

With reference to FIG. 8, after the hot carrier stress inspection is performed on the three transistor structures (in the experimental example, the comparison example 1, and the comparison example 2), it can be found that the reduction of channel length easily leads to the threshold voltage shift in the transistor structure before the adjustment of the first width. Namely, the amount of the threshold voltage shift in the comparison example 2 is greater than the amount of the threshold voltage shift in the comparison example 1. However, after the first width is adjusted, notwithstanding the reduction of the channel length, the amount of the threshold voltage shift in the experimental example may be less than that in the comparison example 1 (i.e., the channel length is not reduced yet). Hence, the proper adjustment of the first width may enhance the IV performance of the transistor structure as well as ensure favorable reliability of the transistor structure.

Figure 9:
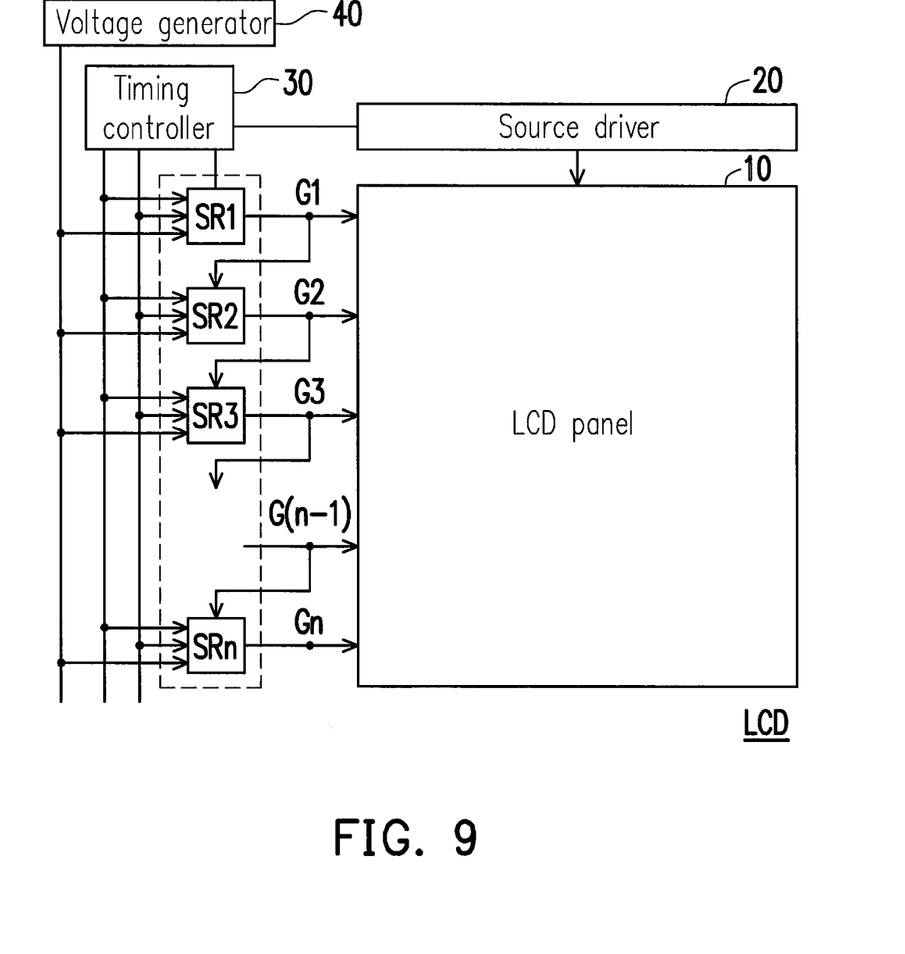
FIG. 9 illustrates an LCD in which a driving circuit structure described in an embodiment of the invention is applied.

Note that the transistor structures 100, 200, 400, 500, and 600 described above are applicable to the driving circuit structure in a display panel. FIG. 9 illustrates an LCD in which the driving circuit structure described in an embodiment of the invention is applied. The transistor structures 100, 200, 400, 500, and 600 described in the previous embodiments are applicable to the driving circuit structure in the LCD. The driving circuit structure is, for instance, a gate driver on array (GOA) structure or a source driver on array (SOA) structure.

With reference to FIG. 9, the LCD exemplarily includes an LCD panel 10, a source drive 20, a timing controller 30, a voltage generator 40, and a gate driving circuit structure DCS, and the gate driving circuit structure DCS may include a plurality of shift registers SR1, SR2, . . . , and SRn electrically connected to one another. The gate driving circuit structure DCS, the source driver 20, the timing controller 30, and the voltage generator 40 are located at peripheries of the LCD panel 10, for instance. The voltage generator 40 and the timing controller 30 may be electrically connected to the shift registers SR1, SR2, . . . , and SRn, respectively; the timing controller 30 and the source driver 20 are electrically connected, and the source driver 20 and the shift registers SR1, SR2, . . . , and SRn are electrically connected to the LCD panel 10.

The transistor structures 100, 200, 400, 500, and 600 described in the previous embodiments are applicable to the gate driving circuit structure DCS, for instance. To be more specific, each of the shift registers SR1, SR2, . . . , and SRn has at least one transistor, and each transistor may have the aforesaid transistor structure 100, 200, 400, 500, or 600.

Figure 10:
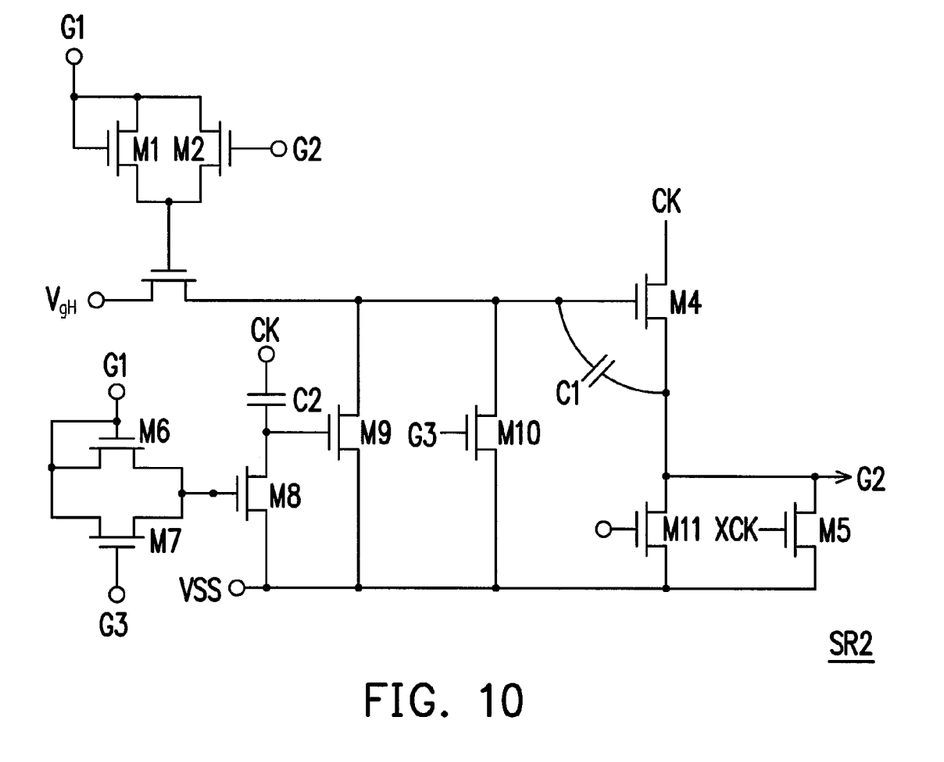
FIG. 10 is a diagram showing circuitry of shift registers in FIG. 9.

The shift register SR2 depicted in FIG. 9 is further elaborated hereinafter with reference to FIG. 10, while the circuitry diagram in FIG. 10 is applicable to the other shift registers SR1, SR3, . . . , and SRn, or the structures, configurations, or components of the other shift registers SR1, SR3, . . . , and SRn may be changed based on the circuitry diagram in FIG. 10. FIG. 10 is a diagram showing circuitry of the shift registers in FIG. 9. With reference to FIG. 10, the shift register SR2 described in the present embodiment may include a plurality of transistors M1, M2, . . . , and M11 and a plurality of capacitors C1 and C2. A gate of the transistor M1 is coupled to a first drain/source of the transistor M1 for receiving a scan signal G1 output by the shift register SR1. A first drain/source of the transistor M2 can be coupled to the first drain/source of the transistor M1, and a second drain/source of the transistor M2 can be coupled to a second drain/source of the transistor M1.

A gate of the transistor M3 can be coupled to the second drain/source of the transistor M1 and the second drain/source of the transistor M2, and a first drain/source of the transistor M3 receives a direct voltage $V_{gH}$ supplied by the voltage generator 40. A gate of the transistor M4 is coupled to a second drain/source of the transistor M3, a first drain/source of the transistor M4 receives a clock signal CK provided by the timing controller 30, and a second drain/source of the transistor M4 is coupled to a gate of the transistor M2 for outputting a scan signal G2.

A gate of the transistor M5 receives a clock signal XCK provided by the timing controller 30, a first drain/source of the transistor M5 may be coupled to the second drain/source of the transistor M4, and a second drain/source of the transistor M5 may be coupled to a reference voltage VSS. One end of the capacitor C1 is coupled to a gate of the transistor M4, and the other end of the capacitor C1 is coupled to the second drain/source of the transistor M4. According to another embodiment, the capacitor C1 may be omitted if the dimension of the transistor M4 is sufficient.

A gate of the transistor M6 is coupled to a first drain/source of the transistor M6 for receiving the scan signal G1 output by the shift register SR1. A gate of the transistor M7 receives a scan signal G3 output by the shift register SR3. A first drain/source of the transistor M7 may be coupled to the first drain/ source of the transistor M6, and a second drain/source of the transistor M7 is coupled to a second drain/source of the transistor M6.

A gate of the transistor M8 can be coupled to the second drain/source of the transistor M6 and the second drain/source of the transistor M7, and a first drain/source of the transistor M8 is coupled to the reference voltage VSS. One end of the capacitor C2 receives the clock signal CK provided by the timing controller 30, and the other end of the capacitor C2 is coupled to a second drain/source of the transistor M8. A gate of the transistor M9 can be coupled to the second drain/source of the transistor M8, a first drain/source of the transistor M9 can be coupled to the gate of the transistor M4, and a second drain/source of the transistor M9 is coupled to the reference voltage VSS.

A gate of the transistor M10 receives the scan signal G3 output by the shift register SR3. A first drain/source of the transistor M10 may be coupled to the gate of the transistor M4, and a second drain/source of the transistor M10 is coupled to the reference voltage VSS. A gate of the transistor M11 is coupled to the second drain/source of the transistor M8, a first drain/source of the transistor M11 can be coupled to the second drain/source of the transistor M4, and a second drain/source of the transistor M11 is coupled to the reference voltage VSS.

Note that the transistors M1, M2, . . . , and M11 may have the transistor structures 100, 200, 400, 500, and 600 described above. Namely, through proper adjustment of the ratio of the first width to the second width, the transistors M1, M2, . . . , and M11 can accomplish favorable heat dissipation effects. Thereby, the self-heating effects of the transistors M1, M2, . . . , and M11 may be alleviated, and the reliability of the transistors M1, M2, . . . , and M11 may be enhanced.

To sum up, the first and second electrodes are alternately arranged on the gate electrode according to an embodiment of the invention, and the transistor structure can have satisfactory electrical performance (i.e., current-voltage performance) and achieve favorable heat dissipation effect through adjustment of the ratio of the first width to the second width. Thereby, the self-heating effect of the transistor structure may be alleviated, and the reliability of the transistor structure may be enhanced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A transistor structure disposed on a substrate, the transistor structure comprising:
    a gate electrode;
    a gate insulating layer overlapping the gate electrode;
    a channel layer overlapping the gate electrode, the gate insulating layer being located between the channel layer and the gate electrode;
    a first connection line overlapping the gate electrode, the first connection line being arranged along a first direction, the gate insulating layer being located between the first connection line and the gate electrode;
    a plurality of first electrodes and a plurality of second electrodes, the first and second electrodes overlapping the gate electrode, the gate insulating layer being located among the first electrodes, the second electrodes, and the gate electrode, the first electrodes being located at two sides of the first connection and the first connection line being located between a part of the first electrodes and another part of the first electrodes, the second electrodes being located at two sides of the first connection line and the first connection line being located between a part of the second electrodes and another part of the second electrodes, the first and second electrodes being alternately arranged along the first direction at the two sides of the first connection, the first electrodes being electrically connected to the first connection line, wherein each of the first electrodes has a first width along the first direction, each of the second electrodes has a second width along the first direction, and a ratio of the first width to the second width ranges from 2 to 20; and
    a second connection line arranged along the first direction and electrically connected to the second electrodes.

2. The translator structure as recited in claim 1, wherein when the first electrodes are source electrodes, the second electrodes are drain electrodes, and when the first electrodes are drain electrodes, the second electrodes are source electrodes.

3. The transistor structure as recited in claim 1, wherein the ratio of the first width to the second width ranges from 2.2 to 10.

4. The transistor structure as recited in claim 1, wherein the ratio of the first width to the second width ranges from 2.5 to 5.

5. The transistor structure as recited in claim 1, wherein the first electrodes and the second electrodes extend along a second direction, and the second direction is substantially perpendicular to the first direction.

6. A driving circuit structure disposed on a substrate, the driving circuit structure comprising:
    a plurality of shift registers electrically connected to one another, each of the shift registers having at least one transistor structure, each of the at least one transistor structure comprising:
    a gate electrode;
    a gate insulating layer overlapping the gate electrode;
    a channel layer overlapping the gate electrode, the gate insulating layer being located between the channel layer and the gate electrode;
    a first connection line overlapping the gate electrode, the first connection line being arranged along a first direction, the gate insulating layer being located between the first connection line and the gate electrode;
    a plurality of first electrodes and a plurality of second electrodes, the first and second electrodes overlapping the gate electrode, the gate insulating layer being located among the first electrodes, the second electrodes, and the gate electrode, the first electrodes being located at two sides of the first connection and the first connection line being located between a part of the first electrodes and another part of the first electrodes, the second electrodes being located at two sides of the first connection line and the first connection line being located between a part of the second electrodes and another part of the second electrodes, the first and second electrodes being alternately arranged along the first direction at the two sides of the first connection, the first electrodes being electrically connected to the first connection line, wherein each of the first electrodes has a first width along the first direction, each of the second electrodes has a second width along the first direction, and a ratio of the first width to the second width ranges from 2 to 20; and a second connection line arranged along the first direction and electrically connected to the second electrodes.

* * * * *